(12) United States Patent
Miyoshi et al.

(10) Patent No.: US 9,954,153 B2
(45) Date of Patent: Apr. 24, 2018

(54) LIGHT-EMITTING DEVICE AND METHOD OF MANUFACTURING SAME

(71) Applicant: NICHIA CORPORATION, Anan-shi, Tokushima (JP)

(72) Inventors: Tomonori Miyoshi, Tokushima (JP); Kenji Ozeki, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/636,550

(22) Filed: Jun. 28, 2017

(65) Prior Publication Data

US 2017/0301839 A1    Oct. 19, 2017

Related U.S. Application Data

(60) Continuation of application No. 15/262,891, filed on Sep. 12, 2016, now Pat. No. 9,722,153, which is a
(Continued)

(30) Foreign Application Priority Data

Mar. 14, 2014  (JP) ................................ 2014-051754
Feb. 25, 2015  (JP) ................................ 2015-035340

(51) Int. Cl.
  *H01L 33/00*  (2010.01)
  *H01L 33/58*  (2010.01)
  (Continued)

(52) U.S. Cl.
  CPC ............ *H01L 33/58* (2013.01); *H01L 33/505* (2013.01); *H01L 33/507* (2013.01); *H01L 33/54* (2013.01);
  (Continued)

(58) Field of Classification Search
  CPC ......... H01L 33/52; H01L 33/54; H01L 33/58; H01L 33/507; H01L 33/505;
  (Continued)

(56) References Cited

U.S. PATENT DOCUMENTS

2009/0230408 A1   9/2009  Meng et al.
2010/0295077 A1   11/2010 Melman
(Continued)

FOREIGN PATENT DOCUMENTS

JP    2002-141559 A    5/2002
JP    2010-219324 A    9/2010
(Continued)

OTHER PUBLICATIONS

Notice of Allowance issued in U.S. Appl. No. 14/657,913, dated Mar. 23, 2016.
(Continued)

*Primary Examiner* — Thanh Y Tran
(74) *Attorney, Agent, or Firm* — Foley & Lardner LLP

(57) ABSTRACT

A light-emitting device includes a substrate; a light-emitting element mounted on the substrate; a first light-transmissive member bonded to an upper surface of the light-emitting element via an adhesive; and a second light-transmissive member placed on an upper surface of the first light-transmissive member. In a plan view of the light-emitting device, a peripheral edge of a lower surface of the first light-transmissive member is positioned more inward than a peripheral edge of the upper surface of the light-emitting element. The adhesive extends from the upper surface of the light-emitting element to a lower surface of the second light-transmissive member, the adhesive covers a side surface of the first light-transmissive member, and the adhesive is separated from the substrate.

13 Claims, 10 Drawing Sheets

Related U.S. Application Data division of application No. 14/657,913, filed on Mar. 13, 2015, now Pat. No. 9,472,737.

(51) Int. Cl.
  *H01L 33/60* (2010.01)
  *H01L 33/50* (2010.01)
  *H01L 33/54* (2010.01)
  *H01L 27/15* (2006.01)

(52) U.S. Cl.
  CPC ............ *H01L 33/60* (2013.01); *H01L 27/156* (2013.01); *H01L 2933/0058* (2013.01)

(58) Field of Classification Search
  CPC ........... H01L 2933/0058; H01L 33/502; H01L 33/56; H01L 33/60; H01L 27/15; H01L 2933/0041; H01L 2933/005; H01L 2224/73253; H01L 2924/181
  See application file for complete search history.

(56) References Cited

U.S. PATENT DOCUMENTS

| | | |
|---|---|---|
| 2011/0204465 A1 | 8/2011 | Meng |
| 2011/0309388 A1 | 12/2011 | Ito et al. |
| 2012/0025218 A1 | 2/2012 | Ito et al. |
| 2012/0235169 A1 | 9/2012 | Seko et al. |
| 2012/0242216 A1 | 9/2012 | Kotani et al. |
| 2013/0329440 A1 | 12/2013 | Tsutsumi et al. |
| 2014/0186980 A1* | 7/2014 | Igarashi ................. H01L 33/50 438/27 |
| 2015/0077982 A1* | 3/2015 | Urano ..................... H01L 33/58 362/217.14 |
| 2015/0102366 A1 | 4/2015 | Wada |
| 2015/0108510 A1* | 4/2015 | Urano ................... H01L 33/486 257/88 |
| 2015/0155450 A1 | 6/2015 | Oka |
| 2015/0188004 A1 | 7/2015 | Ozeki et al. |

FOREIGN PATENT DOCUMENTS

| | | |
|---|---|---|
| JP | 2010-238846 A | 10/2010 |
| JP | 2010-283281 A | 12/2010 |
| JP | 2012-004303 A | 1/2012 |
| JP | 2012-169189 A | 9/2012 |
| JP | 2015-079805 A | 4/2015 |

OTHER PUBLICATIONS

Notice of Allowance issued in U.S. Appl. No. 14/657,913, dated Jun. 16, 2016.

Restriction Requirement issued in U.S. Appl. No. 14/657,913, dated Jan. 14, 2016.

Ex Parte Quayle Action issued in U.S. Appl. No. 15/262,891, dated Jan. 18, 2017.

Notice of Allowance issued in U.S. Appl. No. 15/262,891, dated Mar. 30, 2017.

\* cited by examiner

LIGHT-EMITTING DEVICE AND METHOD OF MANUFACTURING SAME

CROSS-REFERENCE TO RELATED APPLICATIONS

The present application is a continuation of U.S. patent application Ser. No. 15/262,891, filed on Sep. 12, 2016, which is a divisional of U.S. patent application Ser. No. 14/657,913, filed on Mar. 13, 2015, which claims priority to Japanese Patent Application No. 2014-051754, filed on Mar. 14, 2014, and Japanese Patent Application No. 2015-035340, filed on Feb. 25, 2015, the contents of which are all hereby incorporated by reference in their entireties.

BACKGROUND

1. Field

The present disclosure relates to a light-emitting device and a method of manufacturing the light-emitting device.

2. Description of the Related Art

Conventionally, a light-emitting device has been proposed in which a plate-like optical layer (a second light-transmissive member) is bonded to a light-emitting element via a transparent member (an adhesive) (refer to Japanese Patent Application Laid-open No. 2012-4303).

However, the conventional light-emitting device described above may lead to the transparent member (the adhesive) sometimes dripping from between the light-emitting element and the plate-like optical layer (the second light-transmissive member) and reaching an upper surface of a substrate before the transparent member (the adhesive) hardens, thereby causing light emitted from the light-emitting element to travel through the transparent member (the adhesive) and enter the upper surface of the substrate to be absorbed by the substrate. cl SUMMARY The problem described above may be solved by a light-emitting device in which an adhesive is arranged so as to be separated from a substrate. An example of such a light-emitting device includes a substrate, a light-emitting element mounted on the substrate, a first light-transmissive member bonded to an upper surface of the light-emitting element via an adhesive, and a second light-transmissive member placed on an upper surface of the first light-transmissive member, wherein a peripheral edge of a lower surface of the first light-transmissive member is positioned more inward than a peripheral edge of the upper surface of the light-emitting element in a plan view, and the adhesive is provided so as to extend from the upper surface of the light-emitting element to a lower surface of the second light-transmissive member while covering a side surface of the first light-transmissive member, and is arranged so as to be separated from the substrate.

According to embodiments of the present invention, absorption of light by the substrate can be suppressed and optical output of the light-emitting device can be improved.

DETAIL DESCRIPTION

[Light-Emitting Device 100 according to First Embodiment]

Figure 1A:
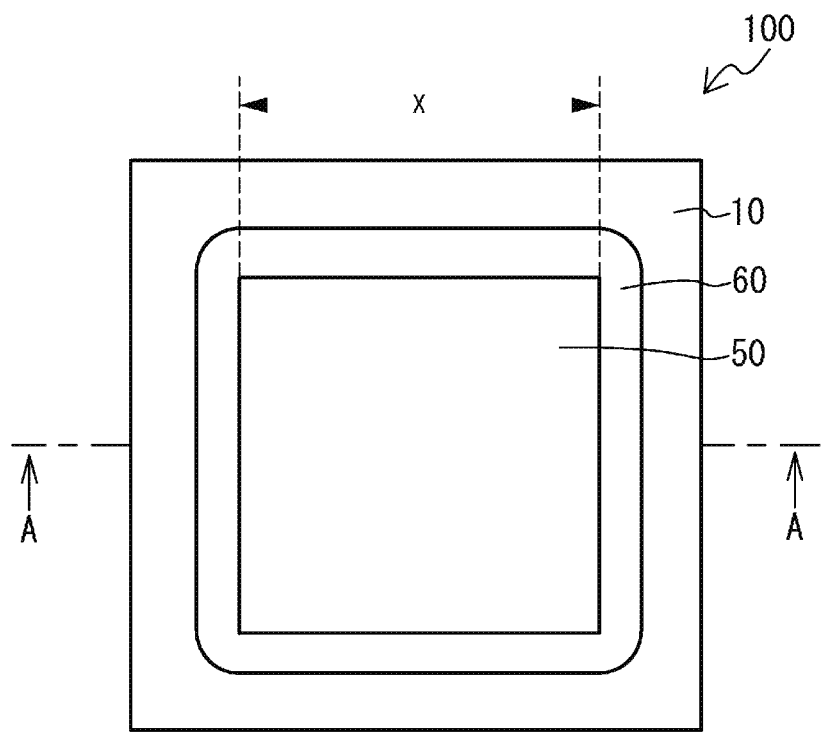
FIG. 1A is a schematic plan view of a light-emitting device according to a first embodiment and FIG. 1B is a diagram showing a section A-A in FIG. 1A.
Figure 1B:
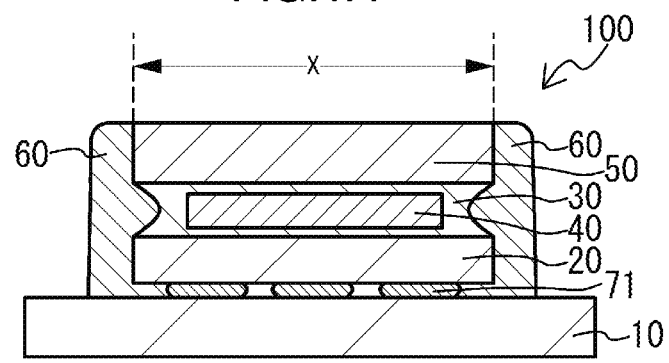

FIG. 1A is a schematic plan view of a light-emitting device according to a first embodiment and FIG. 1B is a diagram showing a section A-A in FIG. 1A.

As shown in FIGS. 1A and 1B, a light-emitting device 100 according to the first embodiment includes a substrate 10, a light-emitting element 20 mounted on the substrate 10, a first light-transmissive member 40 bonded to an upper surface of the light-emitting element 20 via an adhesive 30, and a second light-transmissive member 50 placed on an upper surface of the first light-transmissive member 40. A peripheral edge of a lower surface of the first light-transmissive member 40 is positioned more inward than a peripheral edge of the upper surface of the light-emitting element 20 in a plan view, and the adhesive 30 is provided so as to extend from the upper surface of the light-emitting element 20 to a lower surface of the second light-transmissive member 50 while covering a side surface of the first light-transmissive member 40, and the adhesive 30 is arranged so as to be separated from the substrate 10.

An orderly description will be given below.

(Substrate 10)

For the substrate 10, a substrate with an insulating property such as a substrate made of glass epoxy, resin, or ceramics (HTCC, LTCC) can be used. In particular, a substrate using ceramics with superior heat resistance and weather resistance is favorable. Examples of ceramic material include alumina, aluminum nitride, and mullite. An insulating material such as BT resin, glass epoxy resin, and epoxy-based resin may be combined with such ceramic material.

(Light-Emitting Element 20)

The light-emitting element 20 is mounted on the substrate 10. While a method of mounting the light-emitting element 20 on the substrate 10 is not particularly limited, in the first embodiment, it is assumed that the light-emitting element 20 is flip-chip mounted on the substrate 10. A so-called light-emitting diode is favorably used as the light-emitting element 20. Particular examples include light-emitting diodes manufactured by forming stacked structures on growth substrates. To form such a stacked structure, various semiconductors can be used. For example, a nitride semiconductor (InN, AlN, GaN, InGaN, AlGaN, InAlGaN, etc.), a III-V group compound semiconductor, and a II-VI group compound semiconductor can be used as such a semiconductors.

(First Light-Transmissive Member 40)

The first light-transmissive member 40 is bonded to an upper surface of the light-emitting element 20 via the adhesive 30.

A peripheral edge of a lower surface of the first light-transmissive member 40 is positioned more inward than a peripheral edge of the upper surface of the light-emitting element 20 in a plan view. Accordingly, the adhesive 30 on the upper surface of the light-emitting element 20 can be extended onto a side surface of the first light-transmissive member 40. As a result, the side surface of the first light-transmissive member 40 is covered by the adhesive 30. In addition, surface tension of the adhesive 30 acts at end portions (corner portions in contact with the side surface) of the upper surface of the light-emitting element 20. As a result, dripping of the adhesive 30 to the side surface of the light-emitting element 20 can be suppressed and the adhesive 30 can be prevented from reaching the substrate 10.

While a thickness of the first light-transmissive member 40 is not particularly limited, the thinner the better because a light extraction rate from the light-emitting element 20 declines when the first light-transmissive member 40 is thick. Specifically, the thickness of the first light-transmissive member 40 is favorably 40% to 100% of a thickness of the light-emitting element 20.

A peripheral edge of an upper surface of the first light-transmissive member 40 is positioned more inward than a peripheral edge of a lower surface of the second light-transmissive member 50 in a plan view. Accordingly, since extension of the adhesive 30 is suppressed at end portions of the lower surface of the second light-transmissive member 50, the adhesive 30 can be prevented from covering a side surface of the second light-transmissive member 50.

The first light-transmissive member 40 is a member for preventing the adhesive 30 from dripping and reaching the substrate 10 from the side surface of the light-emitting element 20 and, at the same time, a member that enables light emitted by the light-emitting element 20 to propagate. Therefore, a plate-like member made of a material capable of transmitting light emitted by the light-emitting element 20 is favorably used as the first light-transmissive member 40. Examples of a material capable of transmitting light emitted by the light-emitting element 20 include a glass material such as silicate glass, borosilicate glass, and quartz glass, a resin molded body made of silicone resin, silicone modified resin, epoxy resin, phenolic resin, polycarbonate resin, acrylic resin, trimethylpentene resin, polynorbornene resin, or a hybrid resin containing one or more of these resins, and sapphire.

The first light-transmissive member 40 may or may not include a filler such as a fluorescent material or a diffusing agent. The filler may be contained inside the first light-transmissive member 40 or may be provided by applying a layer containing the filler on both or one of the surfaces of the first light-transmissive member 40.

(Second Light-Transmissive Member 50)

The second light-transmissive member 50 is placed on the upper surface of the first light-transmissive member 40. Since the peripheral edge of the upper surface of the first light-transmissive member 40 is positioned more inward than the peripheral edge of the lower surface of the second light-transmissive member 50 in a plan view, a side surface of the second light-transmissive member 50 can be prevented from being covered by the adhesive 30. In other words, the side surface of the second light-transmissive member 50 is readily covered by a light-reflecting member 60 and light can be suppressed from passing through and exiting from the side of the second light-transmissive member 50. Therefore, when an upper surface of the second light-transmissive member 50 is used as a light-emitting surface X of the light-emitting device 100, a difference in luminance between a light-emitting portion and a non-light-emitting portion can be defined to realize a light-emitting device. In addition, in cases where the second light-transmissive member 50 includes a fluorescent material or the like, light with different colors (wavelengths) or luminance can be prevented from being respectively extracted upward and sideways from the second light-transmissive member 50, thereby preventing the occurrence of unevenness in color and luminance.

A thickness of the second light-transmissive member 50 is not particularly limited. However, when the thickness of the second light-transmissive member 50 increases, the thickness of the light-emitting device 100 itself also increases. Therefore, the second light-transmissive member 50 is favorably made thin when downsizing of the light-emitting device 100 is to be considered. Specifically, the thickness of the second light-transmissive member 50 can be set to, for example, around 100 to 300 μm.

The lower surface of the second light-transmissive member 50 is given a same shape (including approximately same shapes) as the light-emitting element 20 in a plan view. Accordingly, since unevenness in color in an outer peripheral portion of the second light-transmissive member 50 is reduced, uniformity in emitted color can be achieved.

The second light-transmissive member 50 is a separated from the first light-transmissive member 40. Bonding between the second light-transmissive member 50 and the first light-transmissive member 40 can be performed by, for example, compression bonding, sintering, adhesion by an adhesive, or adhesion by low-melting point glass. In the light-emitting device 100 according to the first embodiment, the second light-transmissive member 50 is bonded to the first light-transmissive member 40 via the adhesive 30.

A similar material to the first light-transmissive member 40 may be used for the second light-transmissive member 50. While the second light-transmissive member 50 need not necessarily include a filler such as a fluorescent material or a diffusing agent, the second light-transmissive member 50 favorably includes such a filler. When including a filler, the filler may be contained inside the second light-transmissive member 50 or the filler may be provided as a filler-containing layer on both or one of the surfaces of the second light-transmissive member 50. A method of forming the filler-containing layer is not particularly limited and, for example, methods such as spraying, electrodeposition, and electrostatic coating can be used. Alternatively, a fluorescent sheet made of a material created by dispersing a fluorescent material in resin or the like may be bonded to the second light-transmissive member 50.

(Filler)

A fluorescent material, a diffusing agent, or the like can be used as the filler. As the fluorescent material, those that are known in the art can be used. Specific examples include cerium-activated yttrium aluminum garnet (YAG), cerium-activated lutetium aluminum garnet (LAG), europium and/or chromium-activated nitrogen-containing calcium aluminosilicate (CaO—Al$_2$O$_3$—SiO$_2$), and europium-activated silicate ((Sr,Ba)$_2$SiO$_4$). Accordingly, a light-emitting device that emits mixed-color light (for example, white light) of primary light and secondary light in visible wavelengths or a light-emitting device that is excited by ultraviolet primary light to emit secondary light in a visible wavelength can be realized. In particular, as a fluorescent material that emits white light in combination with a blue light-emitting element, a fluorescent material that is excited by blue light to emit broad yellow light is favorably used.

As the fluorescent material, a plurality of types of fluorescent bodies may be used in combination. For example, a color rendering property and color reproducibility may be adjusted by using fluorescent bodies such as Si$_{6-z}$Al$_z$O$_z$N$_{8-z}$:Eu, Lu$_3$Al$_5$O$_{12}$:Ce, BaMgAl$_{10}$O$_{17}$:Eu, BaMgAl$_{10}$O$_{17}$:Eu,Mn, (Zn,Cd)Zn:Cu, (Sr,Ca)$_{10}$(PO$_4$)$_6$C$_{12}$:Eu,Mn, (Sr, Ca)$_2$Si$_5$N$_8$:Eu, CaAlSiB$_x$N$_{3+x}$:Eu, K$_2$SiF$_6$:Mn, and CaAlSiN$_3$:Eu in a combination or a compounding ratio suitable for a desired color tone.

As the diffusing agent, for example, silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, and carbon black can be used.

(Adhesive 30)

The adhesive 30 is provided so as to extend from the upper surface of the light-emitting element 20 to the lower surface of the second light-transmissive member 50 while covering a side surface of the first light-transmissive member 40. Accordingly, the light-emitting element 20, the first light-transmissive member 40, and the second light-transmissive member 50 are bonded to one another.

The adhesive 30 is arranged so as to be separated from the substrate 10. Since arranging the adhesive 30 so as to be separated from the substrate 10 prevents light emitted from the light-emitting element 20 from passing through the adhesive 30 and entering the upper surface of the substrate 10 to be absorbed by the substrate 10, optical output of the light-emitting device 100 can be increased. In addition, if the adhesive 30 drips onto the substrate 10, the dripped adhesive 30 spreads laterally on the substrate 10 and light emitted from the light-emitting element 20 is reflected inside the adhesive 30 which is spread on the substrate 10 and may cause a decline in light flux. However, by arranging the adhesive 30 so as to be separated from the substrate 10, such a decline in light flux can be suppressed.

Furthermore, when the adhesive 30 drips onto the substrate 10, there may be a risk that the dripped adhesive 30 may penetrate into a gap between the light-emitting element 20 and the mounting substrate 10 to cause a decline in thermal shock resistance, particularly in the case where the light-emitting element 20 is flip-chip mounted. However, by arranging the adhesive 30 so as to be separated from the substrate 10, such a decline in thermal shock resistance can also be suppressed. In other words, while a high elasticity resin instead of a low elasticity resin is favorably used as the adhesive 30 from the perspective of increasing adhesion between the respective members, when a high elasticity resin that is used as the adhesive 30 penetrates into a gap between the light-emitting element 20 and the mounting substrate 10, the light-emitting element 20 may rise during resin curing and reflow and may cause a decline in thermal resistance. In a worst case, the light-emitting element 20 may no longer be turned on. With the light-emitting device 100 according to the first embodiment, since the adhesive 30 is arranged so as to be separated from the substrate 10, even in a case of flip-chip mounting in which a gap is created between the light-emitting element 20 and the mounting substrate 10 as described above, a decline in thermal shock resistance can be suppressed and adhesion among the respective members can be increased.

Light emitted from the upper surface of the light-emitting element 20 propagates to the lower surface of the second light-transmissive member 50 via the first light-transmissive member 40 and the adhesive 30. Therefore, a member capable of effectively guiding the light emitted by the light-emitting element 20 to the side of the second light-transmissive member 50 is favorably used as the adhesive 30. In addition, a material capable of ensuring adhesion among the respective members as described above is favorably used as the adhesive 30. Examples of a material with superior light guiding property and adhesion include resin materials such as silicone resin and epoxy resin. Moreover, the adhesive 30 may include a filler. Examples of a filler are similar to those exemplified above. Such fillers are favorably contained in the material constituting the adhesive 30.

(Light-Reflecting Member 60)

The side surface of the second light-transmissive member 50 is favorably coated with the light-reflecting member 60. More favorably, the light-reflecting member 60 is provided so as to extend to the side surface of the light-emitting element 20 and the side surface of the light-emitting element 20 is covered by the light-reflecting member 60. Accordingly, light emitted by the light-emitting element 20 in a lateral direction can be efficiently extracted upward. In other words, light extraction efficiency can be improved by limiting the light-emitting surface X of the light-emitting device 100 to necessary portions and suppressing light emission in unnecessary directions. In addition when the second light-transmissive member 50 contains a filler, since emitted light from the light-emitting element 20 can be suppressed from passing through and exiting the side of the second light-transmissive member 50, an occurrence of unevenness in color and luminance can be prevented.

The light-reflecting member 60 is favorably formed of reflective material having reflectance of 60% or higher and more favorably formed of light-reflecting material having reflectance of 80% or 90% or higher with respect to light from the light-emitting element 20. Such a light-reflecting material can be formed of, for example, ceramics, resin, a dielectric body, pulp, glass, or a composite material thereof. In particular, from the perspective of being able to readily form any shape, the light-reflecting material is favorably formed of resin. Examples of such a resin include thermosetting resin and thermoplastic resin. Specific examples include resins and hybrid resins containing at least one of silicone resin, modified silicone resin, epoxy resin, modified epoxy resin, and acrylic resin. The light-reflecting material favorably contains a light reflecting agent, a light scattering agent, a coloring agent, or the like such as titanium dioxide, silicon dioxide, zirconium dioxide, barium titanate, alumina, aluminum nitride, boron nitride, mullite, niobium oxide, barium sulfate, carbon black, and various rare earth oxides (including yttrium oxide and gadolinium oxide). In addition, the light-reflecting material may contain a fibrous filler such as glass fiber and wollastonite, an inorganic filler such as carbon, or a material with a high heat radiation property (such as aluminum nitride and boron nitride). Moreover, the light-reflecting member 60 may be formed by screen printing, potting, transfer molding, compression molding, and the like.

As described above, with the light-emitting device 100 according to the first embodiment, since the first light-transmissive member 40 whose lower surface has a peripheral edge that is positioned more inward than a peripheral edge of an upper surface of the light-emitting element 20 in a plan view is provided between the light-emitting element 20 and the second light-transmissive member 50, the adhesive 30 can be arranged so as to be separated from the substrate 10 without reaching the substrate 10. Therefore, with the light-emitting device 100 according to the first embodiment, by preventing light emitted by the light-emitting element 20 from passing through the adhesive 30 and entering the upper surface of the substrate 10 to be absorbed by the substrate 10, absorption of light by the substrate 10 can be suppressed and the optical output of the light-emitting device can be improved.

[Light-Emitting Device 200 according to Second Embodiment]

Figure 2A:
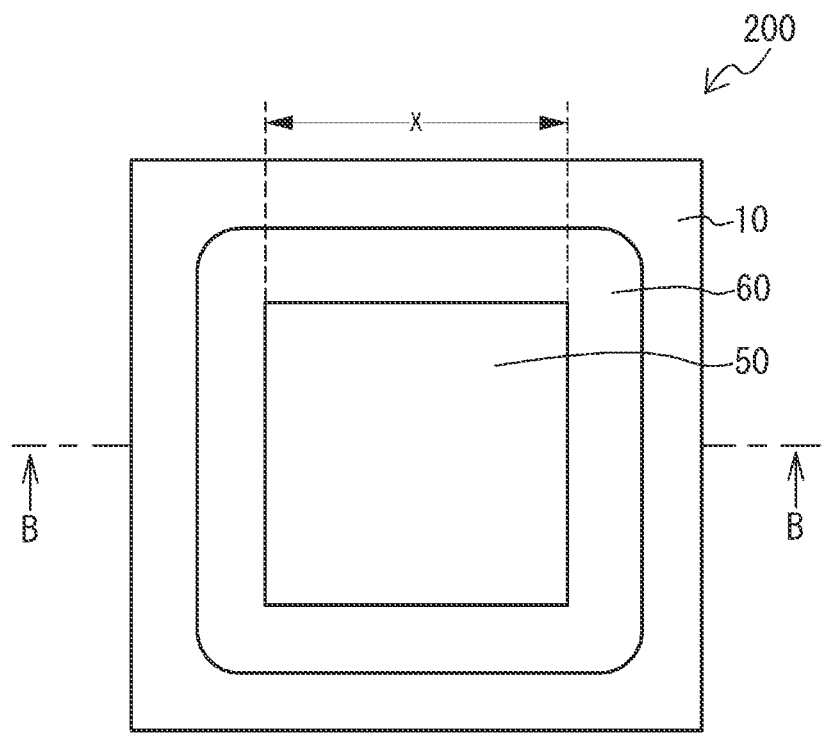
FIG. 2A is a schematic plan view of a light-emitting device according to a second embodiment and FIG. 2B is a diagram showing a section B-B in FIG. 2A.
Figure 2B:
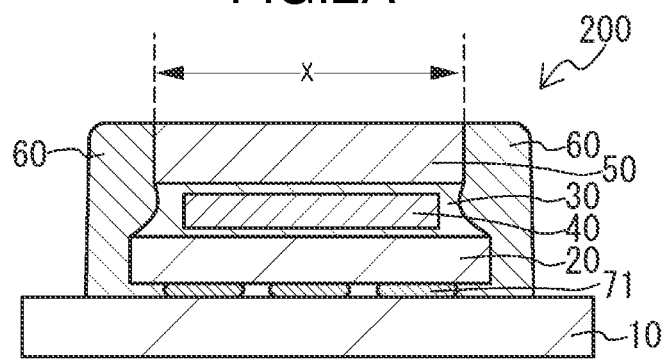

FIG. 2A is a schematic plan view of a light-emitting device according to a second embodiment and FIG. 2B is a diagram showing a section B-B in FIG. 2A.

As shown in FIGS. 2A and 2B, the light-emitting device 200 according to the second embodiment is a light-emitting device in which the peripheral edge of the lower surface of the second light-transmissive member 50 is positioned more inward than the peripheral edge of the upper surface of the light-emitting element 20 in a plan view, while the light-emitting device 100 according to the first embodiment is a light-emitting device in which the lower surface of the second light-transmissive member 50 has a same shape as the light-emitting element 20 in a plan view. With the light-emitting device 200 according to the second embodiment, absorption of light by the substrate 10 can be suppressed and optical output of the light-emitting device can be improved in a similar manner to the light-emitting device 100 according to the first embodiment. Moreover, the second light-transmissive member 50 may or may not include a filler such as a fluorescent material.

Using the first light-transmissive member 40 and the second light-transmissive member 50 enables a light-emitting area of the light-emitting device 200 (the area of the light-emitting surface X; the same applies hereinafter) to be set to a desired size regardless of a size of the light-emitting element 20. In the light-emitting device 200 according to the second embodiment, the light-emitting area of the light-emitting device 200 (the area of the light-emitting surface X) is set smaller than the light-emitting area of the light-emitting element 20 by positioning the peripheral edge of the lower surface of the second light-transmissive member 50 more inward than the peripheral edge of the upper surface of the light-emitting element 20 in a plan view and, at the same time, positioning the peripheral edge of the upper surface of the first light-transmissive member 40 more inward than the peripheral edge of the lower surface of the second light-transmissive member 50. In this manner, since light flux can be narrowed by setting the light-emitting area of the light-emitting device 200 (the area of the light-emitting surface X) smaller than the light-emitting area of the light-emitting element 20, luminance of the light-emitting surface X can be increased and unevenness in luminance on the light-emitting surface X can be suppressed.

As described above, according to the second embodiment, the light-emitting area of the light-emitting device 200 (the area of the light-emitting surface X) becomes smaller than the light-emitting area of the light-emitting element 20 and light flux is narrowed. Therefore, since the light-emitting area of the light-emitting device 200 itself can be reduced while increasing the size of the light-emitting element 20 in order to increase the light flux of the light-emitting device 200, optical design can be facilitated. As a result, a light-emitting device can be provided which is suitable for a lighting device with superior designability that requires a limited light-emitting area, such as an automotive headlight.

The area of the lower surface of the second light-transmissive member 50 in the light-emitting device 200 according to the second embodiment is favorably 70% or more of the area of the upper surface of the light-emitting element 20. Furthermore, the area of the lower surface of the second light-transmissive member 50 is favorably around 105% to 300% of the area of the upper surface of the first light-transmissive member 40. Adopting these ranges prevent the adhesive 30 from exceeding the outer edge of the second light-transmissive member 50 in a plan view. As a result, a difference in luminance between a light-emitting portion (the light-emitting surface X) and a non-light-emitting portion can be defined to realize a light-emitting device with superior visibility.

In general, in the case where a light-transmissive member is arranged on a upper surface of a light emitting element and the peripheral edge of the lower surface of the light-transmissive member is positioned more inward than the peripheral edge of the upper surface of the light-emitting element in a plan view, the side surface of the light-transmissive member may be more readily covered by an adhesive due to extension of the adhesive. As a result, light may pass through and exit the side of the light-transmissive member, so that a difference in luminance between a light-emitting portion and a non-light-emitting portion may become less distinct when the upper surface of the light-transmissive member is used as the light-emitting surface X of the light-emitting device. In addition, in cases where the light-transmissive member includes a fluorescent material or the like, light with different colors (wavelengths) or luminance may be respectively extracted upward and sideways from the light-transmissive member, so that unevenness in color and luminance may occur. However, in the light-emitting device 200 according to the second embodiment, since the second light-transmissive member 50 is arranged on the upper surface of the light-emitting element 20 via the first light-transmissive member 40, the side surface of the second light-transmissive member 50 can easily be covered by the light-reflecting member 60 even if the peripheral edge of the lower surface of the second light-transmissive member 50 is positioned more inward than the peripheral edge of the upper surface of the light-emitting element 20 in a plan view. Therefore, a light-emitting device with superior visibility in which a difference in luminance is defined can be realized, and the occurrence of unevenness in color and luminance of a light-emitting device can be prevented.

[Light-Emitting Device 300 according to Third Embodiment]

Figure 3A:
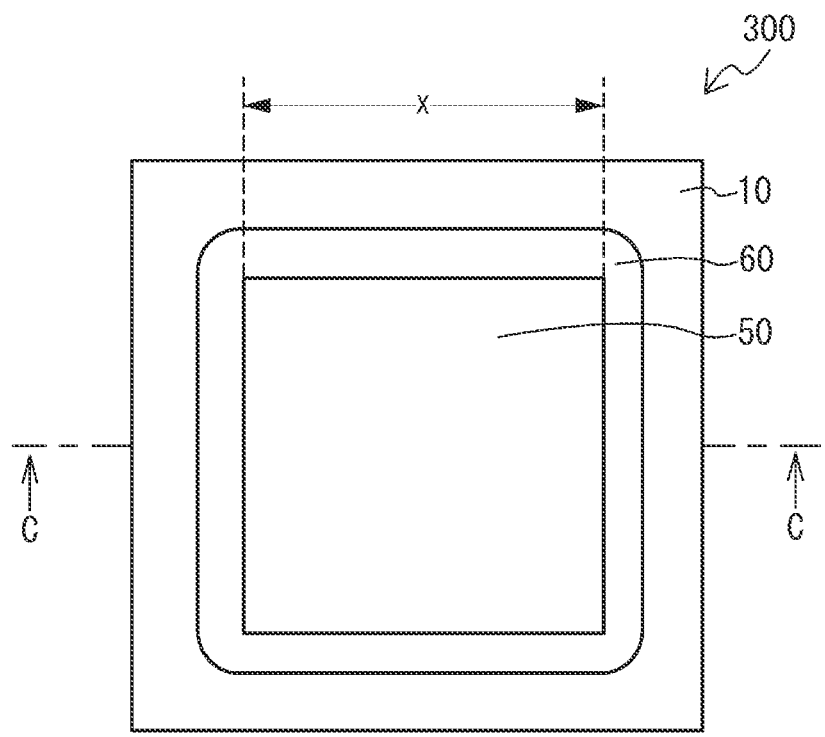
FIG. 3A is a schematic plan view of a light-emitting device according to a third embodiment and FIG. 3B is a diagram showing a section C-C in FIG. 3A.
Figure 3B:
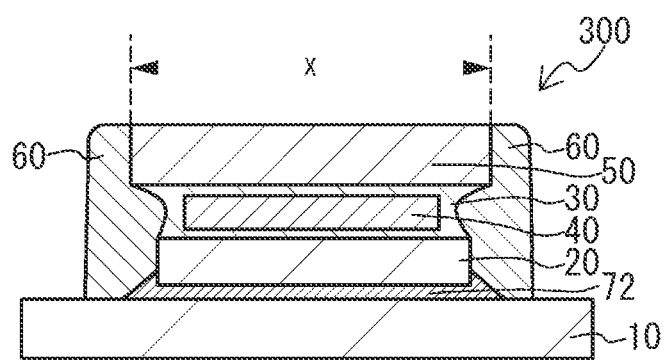

FIG. 3A is a schematic plan view of a light-emitting device according to a third embodiment and FIG. 3B is a diagram showing a section C-C in FIG. 3A.

As shown in FIGS. 3A and 3B, the light-emitting device 300 according to the third embodiment is a light-emitting device in which the peripheral edge of the lower surface of the second light-transmissive member 50 is positioned more outward than the peripheral edge of the upper surface of the light-emitting element 20 in a plan view, while the light-emitting device 100 according to the first embodiment is a light-emitting device in which the lower surface of the second light-transmissive member 50 has a same shape as the light-emitting element 20 in a plan view. With the light-emitting device 300 according to the third embodiment, absorption of light by the substrate 10 can be suppressed and optical output of the light-emitting device can be improved as well as the light-emitting device 100 according to the first embodiment.

According to the third embodiment, since a light-emitting area of the light-emitting device 300 becomes greater than a light-emitting area of the light-emitting element 20, reflection of light by the light-reflecting member 60 can be reduced and light extraction efficiency can be improved. Therefore, according to the third embodiment, a light-emitting device suitable for lighting whose light-emitting area is not particularly limited can be provided.

In the light-emitting device 300 according to the third embodiment, the light-emitting element 20 is mounted by eutectic bonding using a bonding member 72 such as a resin, a paste, or the like instead of flip-chip mounting using a bonding member 71 such as a bump or the like. In the case where the light-emitting element 20 is mounted using the bonding member 72 such as a resin, a paste, or the like, an end portion of the lower surface of the light-emitting element 20 is covered by the bonding member 72. Therefore, when the adhesive 30 drips toward the substrate 10 from the side surface of the light-emitting element 20, the dripped adhesive 30 may more readily travel along an upper surface of the bonding member 72 and may spread laterally on the substrate 10. However, with the light-emitting device 300 according to the third embodiment, as described above, dripping of the adhesive 30 along the side surface of the light-emitting element 20 can be suppressed at the end portion of the upper surface (a corner portion in contact with the side surface) of the light-emitting element 20 due to surface tension of the adhesive 30 and the adhesive 30 is prevented from reaching the substrate 10. Therefore, with the light-emitting device 300 according to the third embodiment, absorption of light by the substrate 10 can be suppressed and optical output of the light-emitting device can be improved even when the light-emitting element 20 is mounted to the substrate 10 by eutectic bonding using the bonding member 72 such as a resin, a paste, or the like.

[Light-Emitting Device 400 according to Fourth Embodiment]

Figure 4A:
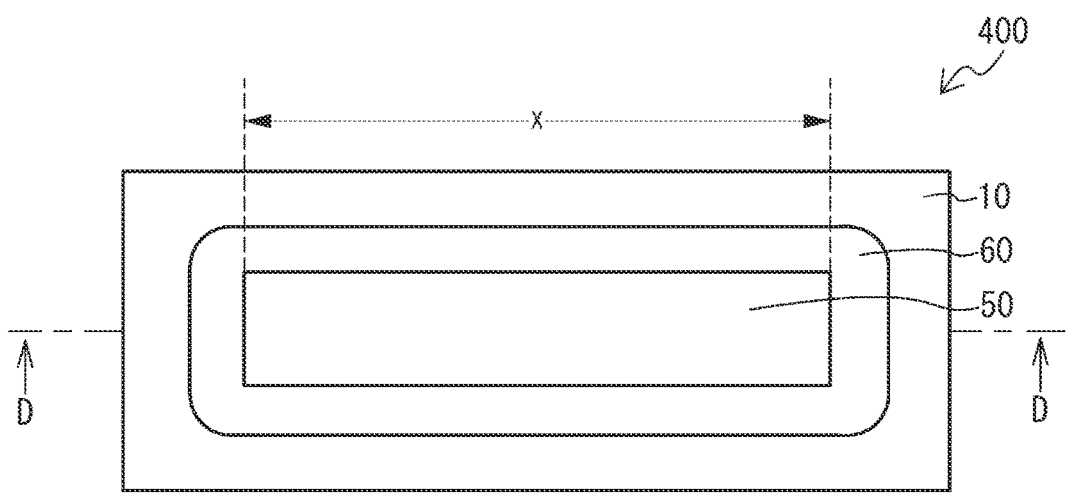
FIG. 4A is a schematic plan view of a light-emitting device according to a fourth embodiment and FIG. 4B is a diagram showing a section D-D in FIG. 4A.
Figure 4B:
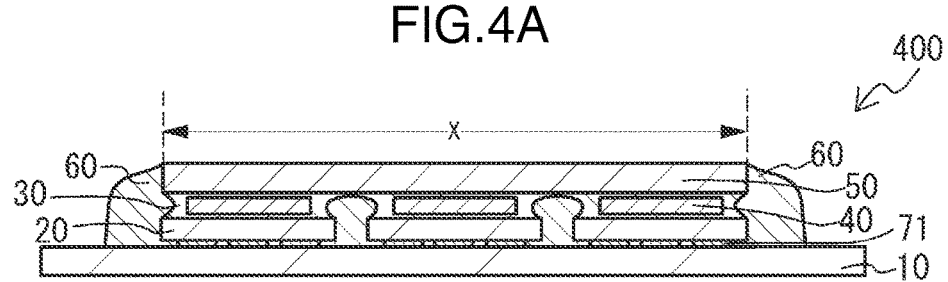

FIG. 4A is a schematic plan view of a light-emitting device according to a fourth embodiment and FIG. 4B is a diagram showing a section D-D in FIG. 4A.

As shown in FIGS. 4A and 4B, the light-emitting device 400 according to the fourth embodiment is a light-emitting device in which a plurality of light-emitting elements 20 are mounted on the substrate 10. The number of light-emitting elements 20 mounted on the substrate 10 is not particularly limited; one or a plurality of light-emitting elements 20 may be mounted.

Figure 5A:
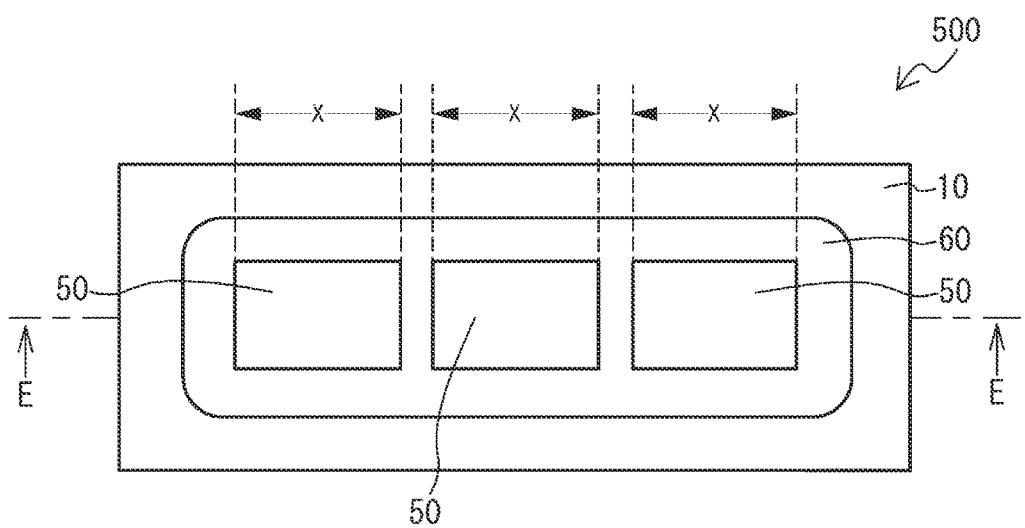
FIG. 5A is a schematic plan view of a light-emitting device according to a fifth embodiment and FIG. 5B is a diagram showing a section E-E in FIG. 5A.
Figure 5B:
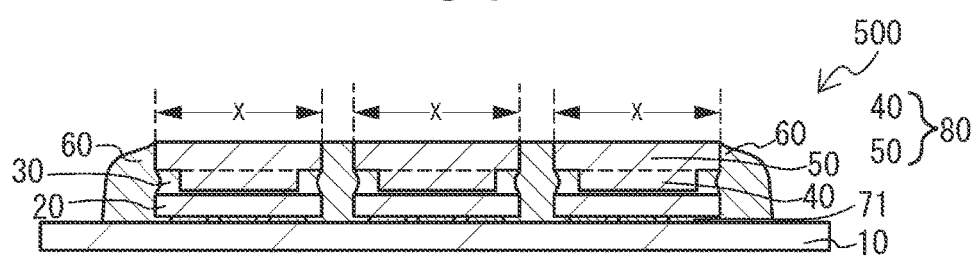

In the case where a plurality of light-emitting elements 20 are provided as in the light-emitting device 400 according to the fourth embodiment, a plurality of second light-transmissive members 50 may be provided to be respectively bonded to the plurality of light-emitting elements 20 (refer to fifth embodiment shown in FIGS. 5A and 5B). Alternatively, as shown in FIGS. 4A and 4B, one second light-transmissive member 50 may be provided and a plurality of first light-transmissive members 40 (and a plurality of light-emitting elements 20) may be bonded to the second light-transmissive member 50. In this case, the plurality of first light-transmissive members 40 (and the plurality of light-emitting elements 20) can be bonded to the second light-transmissive member 50 by assuming collective of outer peripheries of the plurality of light-emitting elements 20 and the plurality of first light-transmissive members 40 to be a peripheral edge of upper surfaces of the light-emitting elements 20 and the first light-transmissive members 40. In the case where one second light-transmissive member 50 is provided and a plurality of first light-transmissive members 40 (and a plurality of light-emitting elements 20) are bonded to the second light-transmissive member 50 in this manner, absorption of light by the substrate 10 can be suppressed and optical output of the light-emitting device can be improved as well as the light-emitting device 100 according to the first embodiment. In addition, one large light-emitting device can be simultaneously constructed.

[Light-Emitting Device 500 according to Fifth Embodiment]

FIG. 5A is a schematic plan view of a light-emitting device according to a fifth embodiment and FIG. 5B is a diagram showing a section E-E in FIG. 5A.

As shown in FIGS. 5A and 5B, the light-emitting device 500 according to the fifth embodiment is a light-emitting device in which a plurality of light-emitting elements 20 are mounted on the substrate 10 and the first light-transmissive member 40 and the second light-transmissive member 50 are integrally provided, while the light-emitting device 100 according to the first embodiment is a light-emitting device in which the first light-transmissive member 40 and the second light-transmissive member 50 are separate bodies. With the light-emitting device 500 according to the fifth embodiment, absorption of light by the substrate 10 can be suppressed and optical output of the light-emitting device can be improved as well as the light-emitting device 100 according to the first embodiment.

The first light-transmissive member 40 and the second light-transmissive member 50 are integrally provided, but a dashed line is drawn between the first light-transmissive member 40 and the second light-transmissive member 50 in FIG. 5B in order to facilitate understanding. Hereinafter, given the first light-transmissive member 40 and the second light-transmissive member 50 are integrally provided, they are collectively referred to as a light-transmissive member 80 in some cases.

In the light-emitting device 500 according to the fifth embodiment, the first light-transmissive member 40 and the second light-transmissive member 50, which are integrally provided, may or may not include a filler. In the case of including a filler, the filler may be contained inside the first light-transmissive member 40 and the second light-transmissive member 50 or the filler may be provided by applying a filler layer or a filler-containing layer on both or one of the surfaces of the first light-transmissive member 40 and the second light-transmissive member 50 by printing, spraying, or the like.

In the light-emitting device 500 according to the fifth embodiment, a lower surface of the first light-transmissive member 40 and the upper surface of the light-emitting element 20 favorably have similar shapes in a plan view. By giving the lower surface of the first light-transmissive member 40 and the upper surface of the light-emitting element 20 similar shapes, when placing the light-transmissive member 80 on the upper surface of the light-emitting element 20, the lower surface of the first light-transmissive member 40 can be aligned to a predetermined position on the upper surface of the light-emitting element 20 using a self-alignment effect.

For example, in the case where the light-emitting element 20 has a rectangular shape in a plan view, by giving the lower surface of the first light-transmissive member 40 a rectangular shape that is a similar shape to the light-emitting element 20 in a plan view, a self-alignment effect can be readily exhibited. Specifically, a similarity ratio of the upper surface of the light-emitting element 20 and the lower surface of the first light-transmissive member 40 is favorably within a range of 1:0.7 to 1.0 and, in the case where the light-transmissive member 80 contains a filler, the ratio is favorably within a range of 1:0.9 to 1.0. By keeping the similarity ratio within these ranges, a light-emitting device in which a self-alignment effect is readily exhibited and which has little unevenness in color or luminance can be provided.

With respect to the light-transmissive member 80, while a length from a lowermost surface of the first light-transmissive member 40 to an uppermost surface of the second light-transmissive member 50 is not particularly limited, the thinner the better when taking a light extraction efficiency into consideration. In addition, with respect to the light-transmissive member 80, when processing accuracy or the like is taken into consideration, a lower limit value of the length from the lower surface of the first light-transmissive member 40 to the upper surface of the second light-transmissive member 50 is favorably smaller than a sum of a lower limit value of a thickness of the first light-transmissive member 40 and a lower limit value of a thickness of the second light-transmissive member 50 in the case where the first light-transmissive member 40 and the second light-transmissive member 50 are used as separate members. Furthermore, when processing accuracy or the like is taken into consideration, an upper limit value of the length from the lower surface of the first light-transmissive member 40 to the upper surface of the second light-transmissive member 50 is favorably smaller than a sum of an upper limit value of the thickness of the first light-transmissive member 40 and an upper limit value of the thickness of the second light-transmissive member 50 in the case where the first light-transmissive member 40 and the second light-transmissive member 50 are used as separate members. Considering the above, specifically, with respect to the light-transmissive member 80, the length from the lower surface of the first light-transmissive member 40 to the upper surface of the second light-transmissive member 50 is favorably within around 120 μm to 250 μm. When the light-transmissive member 80 contains a filler, the thinner the thickness of the first light-transmissive member 40, the better. Specifically, the thickness of the first light-transmissive member 40 is around 5% to 50% of the length from the lower surface of the first light-transmissive member 40 to the upper surface of the second light-transmissive member 50. Accordingly, unevenness in color and luminance at end portions of the light-emitting surface X can be suppressed.

[Light-Emitting Device 600 according to Sixth Embodiment]

Figure 6A:
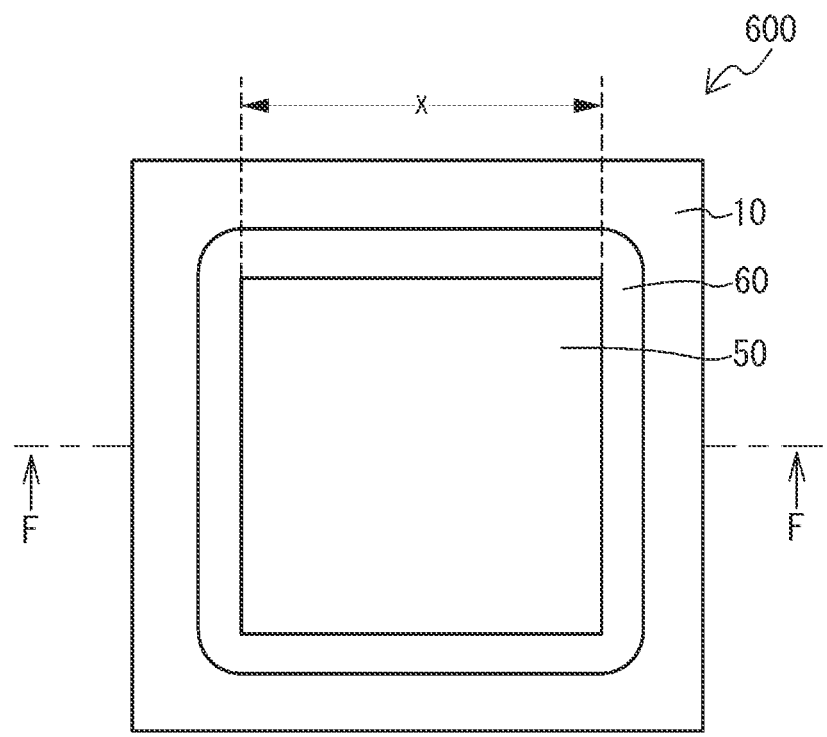
FIG. 6A is a schematic plan view of a light-emitting device according to a sixth embodiment and FIG. 6B is a diagram showing a section F-F in FIG. 6A.
Figure 6B:
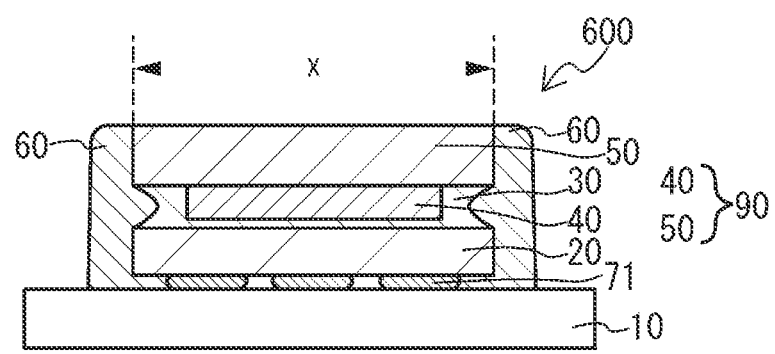

FIG. 6A is a schematic plan view of a light-emitting device according to a sixth embodiment and FIG. 6B is a diagram showing a section F-F in FIG. 6A.

As shown in FIGS. 6A and 6B, a light-emitting device 600 according to the sixth embodiment is a light-emitting device in which the first light-transmissive member 40 and the second light-transmissive member 50 are separate members and are directly bonded with each other to form a light-transmissive member 90, while the light-emitting device 500 according to the fifth embodiment is a light-emitting device in which the first light-transmissive member 40 and the second light-transmissive member 50 are integrally provided (one member). With the light-emitting device 600 according to the sixth embodiment, absorption of light by the substrate 10 can be suppressed and optical output of the light-emitting device can be improved in a similar manner to the light-emitting device 500 according to the fifth embodiment. Examples of a method of direct bonding include fusing, compression bonding, surface activation bonding, and atom diffusion bonding.

[Light-Emitting Device 700 according to Seventh Embodiment]

Figure 7A:
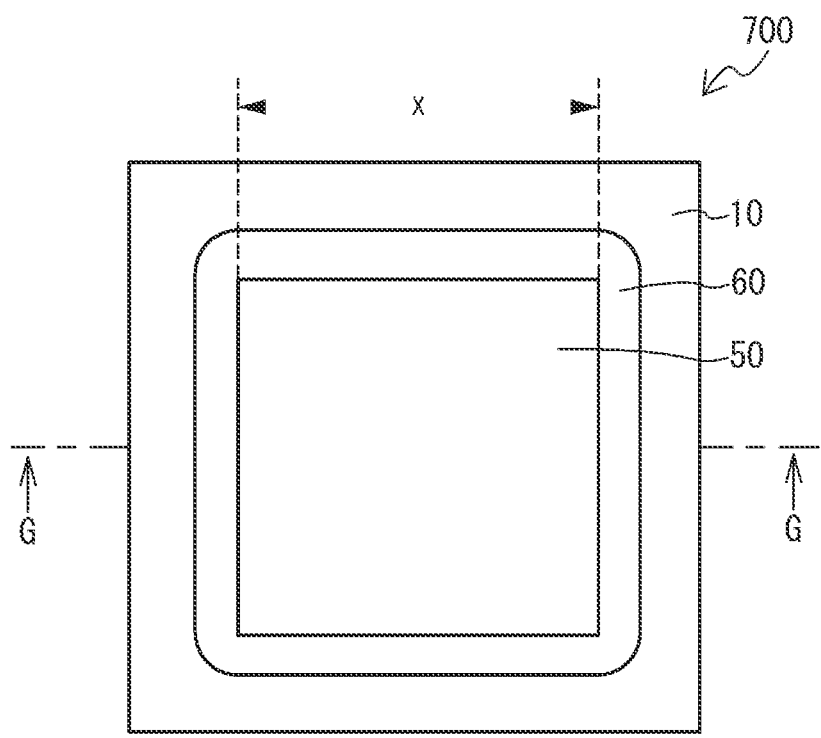
FIG. 7A is a schematic plan view of a light-emitting device according to a seventh embodiment and FIG. 7B is a diagram showing a section G-G in FIG. 7A.
Figure 7B:
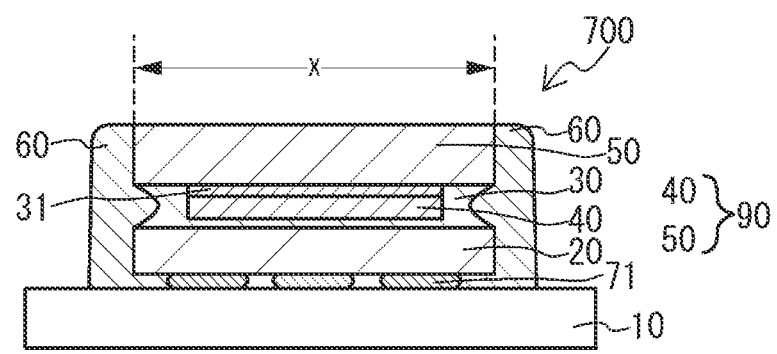

FIG. 7A is a schematic plan view of a light-emitting device according to a seventh embodiment and FIG. 7B is a diagram showing a section G-G in FIG. 7A.

As shown in FIGS. 7A and 7B, a light-emitting device 700 according to the seventh embodiment is a light-emitting device in which the first light-transmissive member 40 and the second light-transmissive member 50 are bonded with each other by an adhesive 31, while the light-emitting device 600 according to the sixth embodiment is a light emitting device in which the first light-transmissive member 40 and the second light-transmissive member 50 are directly bonded with each other. The adhesive 30 and the adhesive 31 are separate. With the light-emitting device 700 according to the seventh embodiment, absorption of light by the substrate 10 can be suppressed and optical output of the light-emitting device can be improved as well as the light-emitting device 600 according to the sixth embodiment.

[Method of Manufacturing Light-Emitting Device 100 according to First Embodiment]

FIGS. 8A to 8F are schematic sectional views describing a method of manufacturing a light-emitting device according to the first embodiment. Hereinafter, a description will be given with reference to FIGS. 8A to 8F.

(First Step)

Figure 8A:
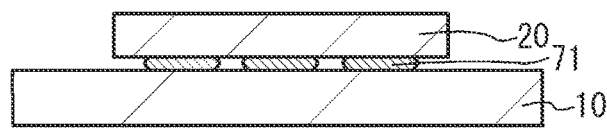
FIG. 8A to 8F is a schematic sectional view illustrating a method of manufacturing the light-emitting device according to a first embodiment.

First, as shown in FIG. 8A, the light-emitting element 20 is mounted on the substrate 10.

(Second Step)

Figure 8B:
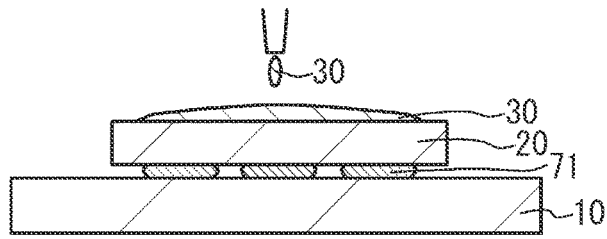

Next, as shown in FIG. 8B, the adhesive 30 is arranged on an upper surface of the light-emitting element 20.

(Third Step)

Figure 8C:

Next, as shown in FIG. 8C, the first light-transmissive member 40, shaped such that a peripheral edge of a lower surface of the first light-transmissive member 40 can be positioned more inward than a peripheral edge of the upper surface of the light-emitting element 20 in a plan view, is prepared. The first light-transmissive member 40 is arranged on the upper surface of the light-emitting element 20 via the adhesive 30 so that the peripheral edge of the lower surface of the first light-transmissive member 40 is positioned more inward than the peripheral edge of the upper surface of the light-emitting element 20 in a plan view.

(Fourth Step)

Figure 8D:
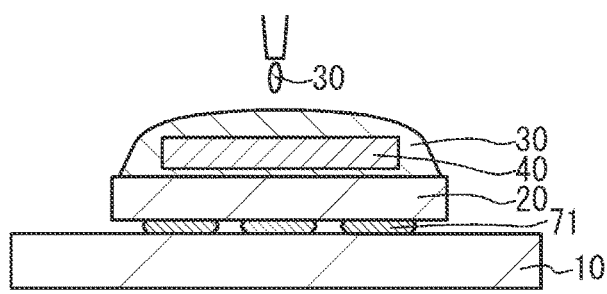

Next, as shown in FIG. 8D, the adhesive 30 is arranged on an upper surface of the first light-transmissive member 40.

(Fifth Step)

Figure 8E:
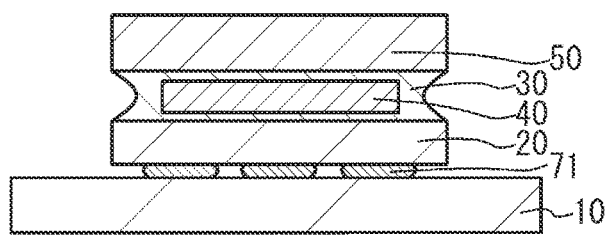

Next, as shown in FIG. 8E, after the second light-transmissive member 50 is arranged on the upper surface of the first light-transmissive member 40 via the adhesive 30, the adhesive 30 is cured. In other words, the adhesive 30 arranged between the light-emitting element 20 and the first light-transmissive member 40 and the adhesive 30 arranged between the first light-transmissive member 40 and the second light-transmissive member 50 are cured at the same time. As a result, the adhesive 30 is provided so as to extend from the upper surface of the light-emitting element 20 to the lower surface of the second light-transmissive member 50 while covering a side surface of the first light-transmissive member 40 and to be separated from the substrate 10. The lower surface of the second light-transmissive member 50, for example, can be given a same shape as the light-emitting element 20 in a plan view. In addition, for example, a peripheral edge of the upper surface of the first light-transmissive member 40 can be positioned more inward than a peripheral edge of a lower surface of the second light-transmissive member 50 in a plan view.

(Sixth Step)

Figure 8F:
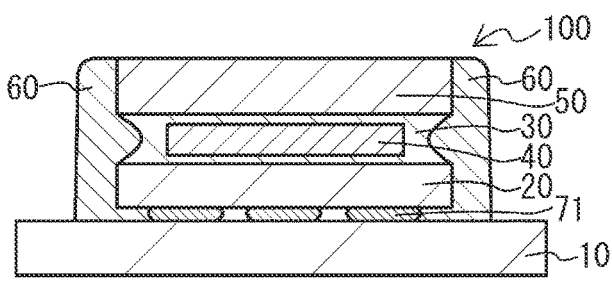

Next, as shown in FIG. 8F, the light-reflecting member 60 is provided so as to cover a side surface of the second light-transmissive member 50 (favorably, the side surface of the second light-transmissive member 50 and the side surface of the light-emitting element 20).

With the method of manufacturing the light-emitting device 100 according to the first embodiment described above, since the adhesive 30 arranged between the light-emitting element 20 and the first light-transmissive member 40 is arranged between the first light-transmissive member 40 and the second light-transmissive member 50, particularly in a light-emitting device having a plurality of light-emitting elements 20, variations in inclinations and heights of light-emitting surfaces due to a difference in height among the plurality of light-emitting elements 20 can be eliminated by adjusting the amount of adhesive 30 and the heights of the light-transmissive member 40 and the light-transmissive member 50 and therefore the method is therefore favorable. While individual descriptions will be omitted, the light-emitting devices 200 to 400 according to the second to fourth embodiments can also be manufactured by similar steps to those described above.

However, in the method of manufacturing the light-emitting device 200 according to the second embodiment, the second light-transmissive member 50 shaped such that a peripheral edge of a lower surface of the second light-transmissive member 50 can be positioned more inward than a peripheral edge of the upper surface of the light-emitting element 20 in a plan view is prepared. Then, the second light-transmissive member 50 is arranged on the upper surface of the first light-transmissive member 40 via the adhesive 30 so that the peripheral edge of the lower surface of the second light-transmissive member 50 is positioned more inward than the peripheral edge of the upper surface of the light-emitting element 20 in a plan view.

In the method of manufacturing the light-emitting device 300 according to the third embodiment, the second light-transmissive member 50 shaped such that a peripheral edge of a lower surface of the second light-transmissive member 50 can be positioned more outward than a peripheral edge of the upper surface of the light-emitting element 20 in a plan view is prepared. Then the second light-transmissive member 50 is arranged on the upper surface of the first light-transmissive member 40 via the adhesive 30 so that the peripheral edge of the lower surface of the second light-transmissive member 50 is positioned more outward than the peripheral edge of the upper surface of the light-emitting element 20 in a plan view.

Furthermore, in the method of manufacturing the light-emitting device 400 according to the fourth embodiment, a plurality of the light-emitting elements 20 are mounted on the substrate 10.

[Method of Manufacturing Light-Emitting Device 500 according to Fifth Embodiment]

FIGS. 9A to 9D are schematic sectional views describing a method of manufacturing a light-emitting device according to the fifth embodiment. Hereinafter, a description will be given with reference to FIGS. 9A to 9D.

(First Step)

Figure 9A:
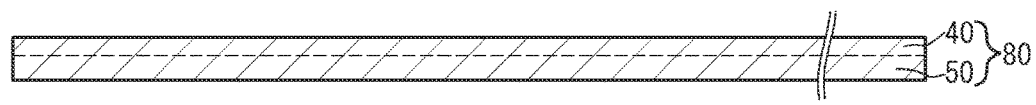
FIG. 9A to 9D are schematic sectional views illustrating a method of manufacturing the light-emitting device according to a fifth embodiment.

First, as shown in FIG. 9A, a light-transmissive member layer 80 is prepared. The light-transmissive member layer 80 is constituted by a first light-transmissive member layer portion and a second light-transmissive member layer portion. The first light-transmissive member layer portion and the second light-transmissive member layer portion are constructed as integrally provided.

(Second Step)

Figure 9B:
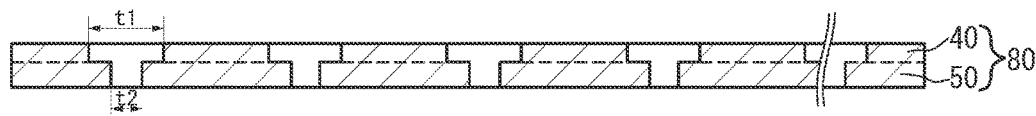

Next, as shown in FIG. 9B, the light-transmissive member layer 80 is divided into separate light-transmissive members 80 to obtain a plurality of light-transmissive members 80 shaped such that a peripheral edge of a lower surface of the first light-transmissive member 40 can be positioned more inward than a peripheral edge of the upper surface of the light-emitting element 20 in a plan view. Specifically, the divided light-transmissive members 80 are obtained from the light-transmissive member layer 80 by cutting the first light-transmissive members 40 using a blade or the like with a blade width of t1 and subsequently cutting the second light-transmissive members 50 using a blade or the like with a blade width of t2 (where blade width t1>t2).

(Third Step)

Figure 9C:
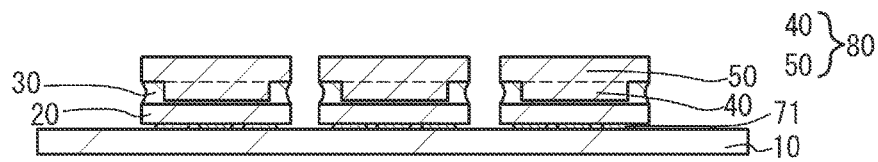

Next, as shown in FIG. 9C, after mounting the light-emitting element 20 on the substrate 10, the lower surface of the first light-transmissive member 40 in the light-transmissive member 80 is bonded to the upper surface of the light-emitting element 20 via the adhesive 30 so that the peripheral edge of the lower surface of the first light-transmissive member 40 in the light-transmissive member 80 is positioned more inward than the peripheral edge of the upper surface of the light-emitting element 20 in a plan view.

(Fourth Step)

Figure 9D:
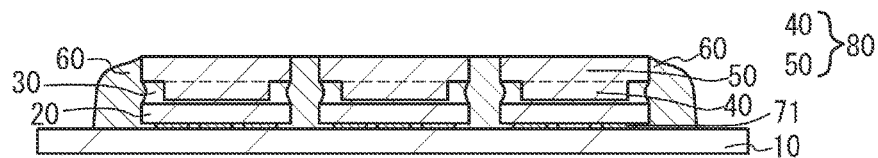

Next, as shown in FIG. 9D, the light-reflecting member 60 is provided so as to cover a side surface of the second light-transmissive member 50 (favorably, the side surface of the second light-transmissive member 50 and the side surface of the light-emitting element 20).

With the method of manufacturing the light-emitting device 500 according to the fifth embodiment described above, since the first light-transmissive member 40 and the second light-transmissive member 50 which are constructed as integrally provided are arranged on the light-emitting element 20, the manufacturing steps can be simplified as compared to a case where the first light-transmissive member 40 is arranged on the light-emitting element 20 and the second light-transmissive member 50 that is separate from the first light-transmissive member 40 is subsequently arranged on the first light-transmissive member 40.

[Method of Manufacturing Light-Emitting Device 600 according to Sixth Embodiment]

FIGS. 10A to 10D are schematic sectional views describing a method of manufacturing a light-emitting device according to the sixth embodiment. Hereinafter, a description will be given with reference to FIGS. 10A to 10D.

(First Step)

Figure 10A:
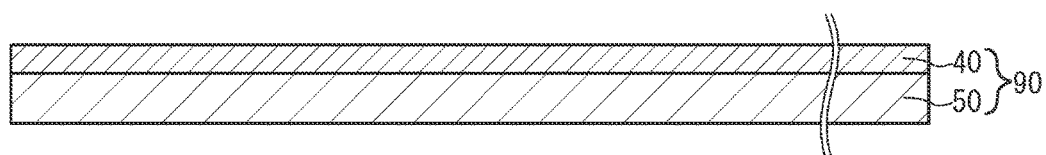
FIG. 10A to 10D are schematic sectional views illustrating a method of manufacturing the light-emitting device according to a sixth embodiment.

First, the light-transmissive member 90 in which a lower surface of the second light-transmissive member 50 is bonded to an upper surface of the first light-transmissive member 40 is prepared. Specifically, as shown in FIG. 10A, a first light-transmissive member layer 40 and a second light-transmissive member layer 50 are prepared. The two assemblies are directly bonded with one another to form a light-transmissive member layer 90.

(Second Step)

Figure 10B:
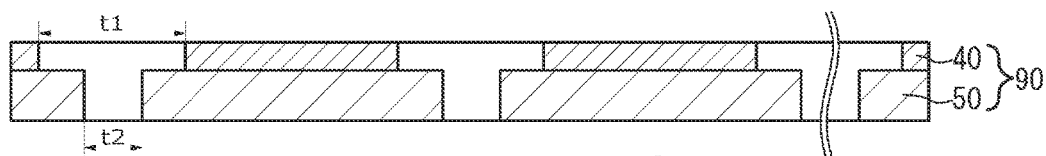

Next, as shown in FIG. 10B, the light-transmissive member layer 90 is divided to obtain a plurality of the light-transmissive members 90 shaped such that a peripheral edge of a lower surface of the first light-transmissive member 40 in the light-transmissive member 90 can be positioned more inward than a peripheral edge of the upper surface of the light-emitting element 20 in a plan view. Specifically, the divided light-transmissive members 90 are obtained from the light-transmissive member layer 90 by cutting the first light-transmissive members 40 using a blade or the like with a blade width of t1 and subsequently cutting the second light-transmissive members 50 using a blade or the like with a blade width of t2 (where blade width t1>t2).

(Third Step)

Figure 10C:
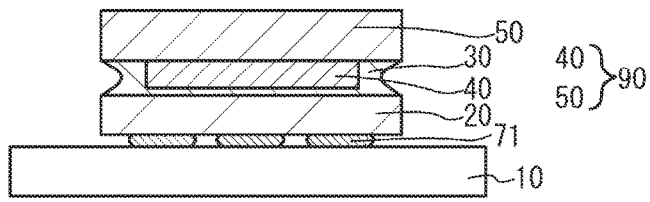

Next, as shown in FIG. 10C, the lower surface of the first light-transmissive member 40 in the light-transmissive member 90 is bonded to the upper surface of the light-emitting element 20 via an adhesive 30 so that the peripheral edge of the lower surface of the first light-transmissive member 40 in the light-transmissive member 90 is positioned more inward than the peripheral edge of the upper surface of the light-emitting element 20 in a plan view.

(Fourth Step)

Figure 10D:
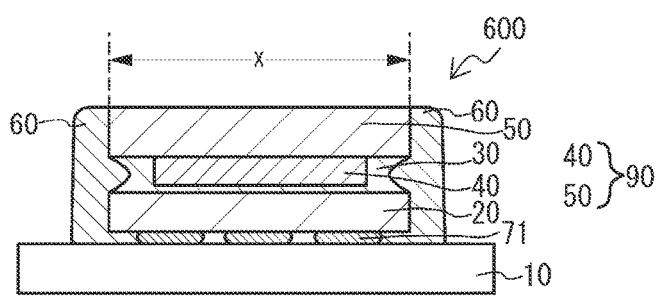

Next, as shown in FIG. 10D, the light-reflecting member 60 is provided so as to cover a side surface of the second light-transmissive member 50 (favorably, the side surface of the second light-transmissive member 50 and the side surface of the light-emitting element 20).

With the method of manufacturing the light-emitting device 600 according to the sixth embodiment described above, since the first light-transmissive member 40 and the second light-transmissive member 50 are bonded to each other before the first light-transmissive member 40 and the second light-transmissive member 50 are arranged on the light-emitting element 20, the manufacturing steps can be simplified as compared to a case where the first light-transmissive member 40 is arranged on the light-emitting element 20 and the second light-transmissive member 50 that is separate from the first light-transmissive member 40 is subsequently arranged on the first light-transmissive member 40.

While individual descriptions will be omitted, the light-emitting device 700 according to the seventh embodiment can also be manufactured by similar steps to those described above. However, with a method of manufacturing the light-emitting device 700 according to the seventh embodiment, the lower surface of the first light-transmissive member 40 and the upper surface of the second light-transmissive member 50 are bonded using an adhesive 31 that is separate from the adhesive 30 used to bond the lower surface of the first light-transmissive member 40 and the upper surface of the light-emitting element 20.

While embodiments have been described above, the description merely represents examples of the present invention and is not intended to limit the invention described in the claims.

What is claimed is:

1. A light-emitting device comprising:
a substrate;
a light-emitting element mounted on the substrate;
a first light-transmissive member bonded to an upper surface of the light-emitting element via an adhesive, wherein an area of an lower surface of the first light-transmissive member is smaller than an area of the upper surface of the light-emitting element;
a second light-transmissive member located on an upper surface of the first light-transmissive member, wherein an upper surface of the second light-transmissive member is a light-emitting surface of the light-emitting device, and wherein an area of the upper surface of the second light-transmissive member is smaller than an area of the upper surface of the light-emitting element; and
a light-reflecting member that covers a side surface of the second light-transmissive member, wherein the upper surface of the second light-transmissive member is exposed from the light-reflecting member,
wherein the adhesive extends from the upper surface of the light-emitting element to a lower surface of the second light-transmissive member, and the adhesive covers a side surface of the first light-transmissive member.

2. The light-emitting device according to claim 1, wherein the light-reflecting member further covers a side surface of the light-emitting element.

3. The light-emitting device according to claim 1, wherein, in a plan view of the light-emitting device, a peripheral edge of the upper surface of the first light-transmissive member is positioned inward of a peripheral edge of the lower surface of the second light-transmissive member.

4. The light-emitting device according to claim 1, wherein a thickness of the second light-transmissive member is in a range of 100 to 300 µm.

5. The light-emitting device according to claim 1, wherein a thickness of the first light-transmissive member is in a range of 40% to 100% of a thickness of the light-emitting element.

6. The light-emitting device according to claim 1, wherein the first light-transmissive member comprises a fluorescent material.

7. The light-emitting device according to claim 1, wherein the second light-transmissive member comprises a fluorescent material.

8. The light-emitting device according to claim 1, wherein both the first light-transmissive member and the second light-transmissive member comprises a fluorescent material.

9. The light-emitting device according to claim 1, wherein the adhesive comprises a fluorescent material.

10. The light-emitting device according to claim 1, wherein the first light-transmissive member and the second light-transmissive member are bonded to each other via the adhesive.

11. The light-emitting device according to claim 1, wherein the first light-transmissive member and the second light-transmissive member are bonded to each other via a second adhesive that is distinct from the adhesive bonding the first light-transmissive member and the light emitting element.

12. The light-emitting device according to claim 1, wherein the first light-transmissive member and the second light-transmissive member are directly bonded to each other.

13. The light-emitting device according to claim 1, wherein the light-reflecting member comprises a resin material.

* * * * *